United States Patent [19]

Chu et al.

[11] Patent Number: 4,707,619

[45] Date of Patent: Nov. 17, 1987

[54] SATURABLE INDUCTOR SWITCH AND PULSE COMPRESSION POWER SUPPLY EMPLOYING THE SWITCH

[75] Inventors: Edmond Y. Chu, Carlsbad; Vance I. Valencia, San Diego, both of Calif.

[73] Assignee: Maxwell Laboratories, Inc., San Diego, Calif.

[21] Appl. No.: 701,079

[22] Filed: Feb. 13, 1985

[51] Int. Cl.[4] .............................................. G11C 13/02

[52] U.S. Cl. .................................... 307/106; 307/415; 336/229; 336/5

[58] Field of Search ............... 307/106, 108, 109, 110, 307/415, 414, 416, 417, 418, 419; 336/212, 216–233

[56] References Cited

U.S. PATENT DOCUMENTS

| | | | |
|---|---|---|---|
| 1,320,980 | 11/1919 | Bowman | 336/229 X |
| 1,362,138 | 12/1920 | Pratt | 336/229 X |
| 1,420,989 | 6/1922 | Fondiller | 336/212 |
| 1,844,432 | 2/1932 | Lyndon | 336/212 |
| 2,523,027 | 9/1950 | Kellogg et al. | 307/109 X |
| 2,579,308 | 12/1951 | Dole | 336/212 X |
| 2,592,721 | 4/1952 | Mott | 336/229 X |
| 2,600,057 | 6/1952 | Kerns | 336/212 X |
| 2,655,623 | 10/1953 | Parker | 336/212 X |
| 2,758,221 | 8/1956 | Williams | 307/415 X |
| 2,802,186 | 8/1957 | Dewitz | 336/171 |
| 2,851,616 | 9/1958 | Thompson | 307/106 X |
| 2,869,004 | 1/1959 | Melville | 307/108 |
| 2,906,978 | 9/1959 | Mikesell | 336/229 X |
| 2,919,414 | 12/1959 | Neitzert | 307/108 X |
| 2,920,297 | 1/1960 | Spicer | 336/229 X |
| 2,961,598 | 11/1960 | Pettit | 323/89 |
| 3,014,170 | 12/1961 | Nygard | 336/212 X |
| 3,041,467 | 6/1962 | Auerbach | 307/88 |
| 3,110,018 | 11/1963 | James | 340/174 |
| 3,126,533 | 3/1964 | Constantine | 307/415 X |
| 3,211,915 | 10/1965 | Poehlman et al. | 307/419 |
| 3,237,137 | 2/1966 | Flamino | 336/229 X |
| 3,414,698 | 12/1968 | Bedford et al. | 336/229 X |
| 3,414,872 | 12/1968 | Barron | 340/3 |
| 3,433,977 | 3/1969 | Gagnon et al. | 307/106 |
| 3,435,431 | 3/1969 | Heckler et al. | 307/412 X |
| 3,448,421 | 6/1969 | Berg et al. | 336/229 X |
| 3,454,916 | 7/1969 | Hoover | 336/229 X |
| 3,541,428 | 11/1970 | Schwarz | 307/401 X |
| 3,609,613 | 9/1971 | Horn | 336/229 X |
| 3,671,810 | 6/1972 | Barnes et al. | 317/20 |
| 3,781,740 | 12/1973 | Kirmis et al. | 336/229 X |
| 3,825,909 | 7/1974 | Engstrom et al. | 340/174 |
| 4,129,820 | 12/1978 | Brock | 336/12 |
| 4,242,594 | 12/1980 | Jensen | 307/98 |
| 4,275,317 | 6/1981 | Laudenslager et al. | 307/415 |
| 4,338,657 | 7/1982 | Lisin et al. | 336/5 X |
| 4,551,700 | 11/1985 | Waldemar | 336/229 X |
| 4,558,297 | 12/1985 | Shigeta et al. | 336/218 X |

FOREIGN PATENT DOCUMENTS

| | | | |
|---|---|---|---|
| 897092 | 5/1962 | United Kingdom | 307/415 |

*Primary Examiner*—William M. Shoop, Jr.
*Assistant Examiner*—Shik Luen Paul Ip
*Attorney, Agent, or Firm*—Fitch, Even, Tabin & Flannery

[57] ABSTRACT

A saturable inductor switch. The switch includes a number of spaced cores disposed adjacent one another with each core being made of ferromagnetic material. An insulative layer is disposed about each core and each core has an electrical winding about the insulative layer for that core. Each winding has a first end and a second end and is electrically connected to its respective core intermediate the ends. The windings are connected in series. All the cores have substantially the same size and shape, and all windings have substantially the same number of turns.

6 Claims, 7 Drawing Figures

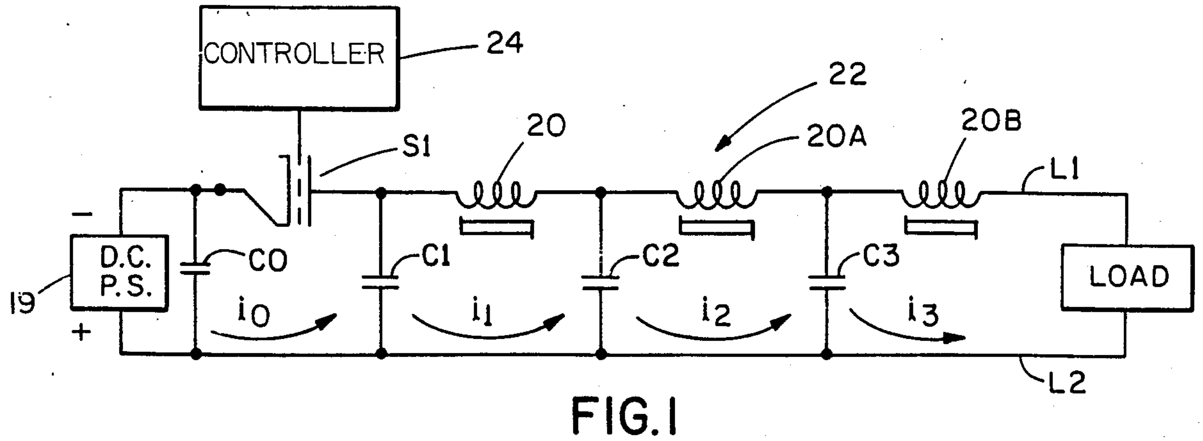
FIG.1
FIG.2
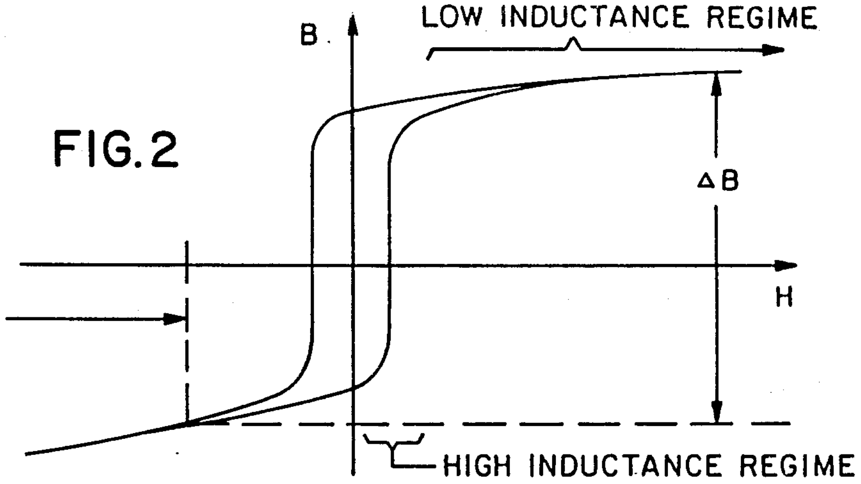
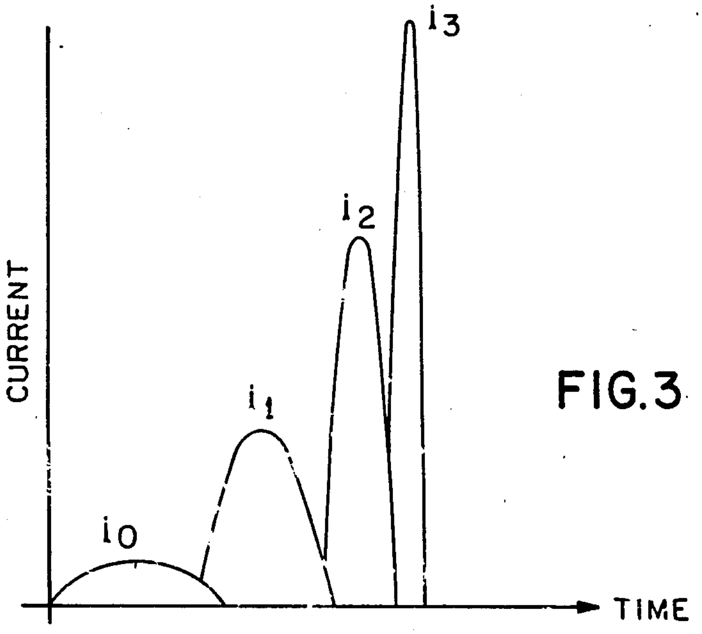
FIG.3

SATURABLE INDUCTOR SWITCH AND PULSE COMPRESSION POWER SUPPLY EMPLOYING THE SWITCH

The present invention relates to electrical switches and, more particularly, to an improved saturable inductor magnetic switch adapted for use in a magnetic pulse compression power supply.

BACKGROUND OF THE INVENTION

A magnetic pulse compression power supply is a network including series saturable inductor magnetic switches and a corresponding number of shunt capacitors with each switch and its respective capacitor forming a pulse compression stage. Such power supplies are interconnected between a conventional power source and a load, and function to provide a high current, fast rise time power pulse to the load. The conventional power source is unable to provide such a pulse because of its internal impedance. While it can only provide a relatively slow charge, the conventional power source can be used to energize the capacitors in the magnetic pulse compression power supply, which capacitors can be discharged very quickly.

The saturable inductor magnetic switches used in the pulse compression power supplies typically include a ferromagnetic core having a winding with insulation between the winding and the core to electrically isolate the two. The switches exhibit a relatively high inductance prior to saturation of the core and a relatively low inductance after saturation. While such switches have performed satisfactorily in the past, certain newer types of loads, such as various lasers or gas jet z-pinch devices, demand higher operating voltages and/or repetitively pulsed operation. The prior art switches are unable to meet these requirements and still exhibit long service life.

A figure of merit for a saturable inductor magnetic switch is the ratio of inductances before and after saturation of the core; the higher the ratio, the better the switch. The ratio can be maximized by minimizing the amount of insulation between the winding and the core, because less insulation results in better coupling of the magnetic flux to the core material. However, at higher voltages, more insulation is required to prevent voltage breakdown. Another way to improve the ratio is to increase the cross-sectional area of the core which reduces its magnetic path length relative to its volume. However, an increase in cross-sectional area while maintaining the total volume of the core results in a reduction of the core surface area for radiating heat. Thus high voltage magnetic switches often have cooling problems when operated at high repetition rates. Of course, the core must be maintained below its Curie temperature (which could be 200° C. or less) if it is to retain its ferromagnetic properties.

A recently proposed switch, for use in a pulse-forming network for supplying power pulses to an electric discharge gas laser, is integrated with lengths of coaxial cable which provide distributed capacitance. The magnetic core for this saturable inductor switch is wound of a laminate including a layer of high permeability material required to have a skin depth in the order of one to two microns. For further information regarding the structure and operation of this saturable inductor switch, reference may be made to U.S. Pat. No. 4,275,317.

SUMMARY OF THE INVENTION

Among the several aspects of the present invention may be noted the provision of an improved saturable inductor switch. The switch provides adequate voltage breakdown protection so the switch may be used at high voltage levels while, at the same time, exhibiting improved coupling of the magnetic flux to the core material. The new switch is usable for repetitively pulsed operation because it is better able to dissipate heat as the core material has increased surface area. The switch of the present invention is reliable in use, has long service life, and is relatively easy and economical to manufacture. Other aspects and features of the present invention will be, in part, apparent and, in part, pointed out in the following specification and in the accompanying claims and drawings.

The saturable inductor switch of the present invention includes a plurality of spaced cores disposed adjacent one another with each core made of ferromagnetic material. Each core has an insulative layer and a electrical winding about its insulative layer. Each winding has a first end and a second end and is electrically connected intermediate its ends to the core on which it is wound. All the windings are connected in series in the switch.

BRIEF DESCRIPTION OF THE DRAWINGS

FIG. 1 is a schematic circuit diagram, partially block in nature, of a magnetic pulse compression power supply including the saturable inductor magnetic switch of the present invention;

FIG. 2 is a plot of magnetizing field intensity versus magnetic flux density illustrating the non-linear inductance properties of the saturable inductor magnetic switch of the present invention;

FIG. 3 is a plot of current versus time showing how the various stages of magnetic switches of the power supply function to compress a current pulse gradually until the output pulse has a fast rise time;

Corresponding reference characters indicate corresponding components throughout the several views of the drawings.

DESCRIPTION OF THE PREFERRED EMBODIMENT

Figure 4:
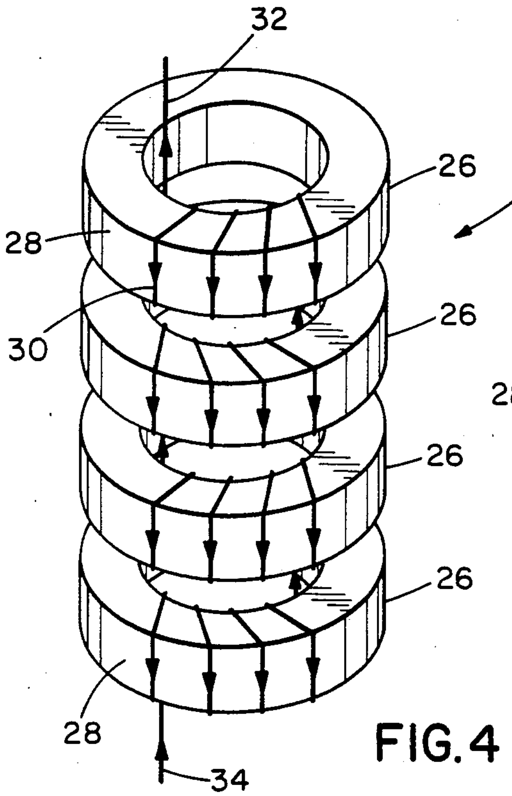
FIG. 4 is an isometric projection illustrating one preferred configuration of a plurality of insulated magnetic cores, each having a winding, of the switch of the present invention.
Figure 5:
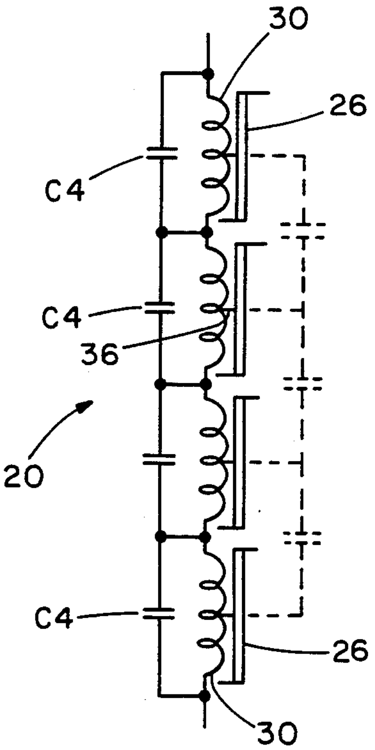
FIG. 5 is a schematic representation of the switch of FIG. 4.
Figure 7:
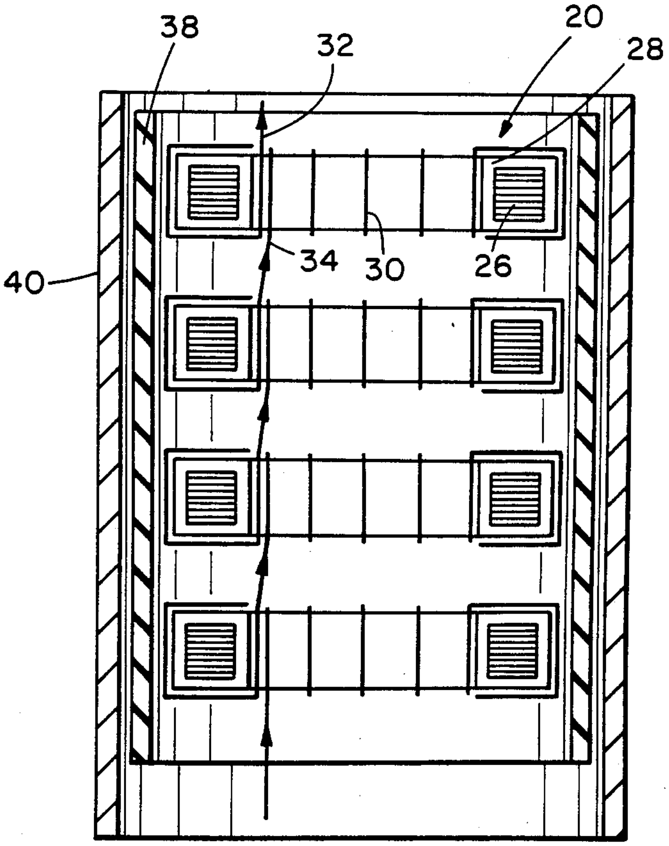
FIG. 7 is an axial sectional view of the saturable inductor switch of the present invention depicting an outer metallic sleeve for providing a current return, and an intermediate dielectric sleeve disposed between the outer sleeve and the cores.

Referring now to the drawings, one preferred embodiment of a saturable inductor switch, particularly adapted for use in a magnetic pulse compression power supply 22 (shown in FIG. 1), is generally indicated at reference character 20 and is best shown in FIGS. 4, 5 and 7. Referring to FIG. 1, the magnetic pulse compression power supply 22 includes series saturable inductor magnetic switches 20–20B and a corresponding number of shunt capacitor banks C1–C3 with each switch and its respective capacitor bank forming a pulse compression stage: C1/20 and C2/20A forming intermediate pulse compression stages and C3/20B (which is connected by conductors L1, L2 to the load such as a laser or a gas jet z-pinch device) constitutes a final or peaking pulse compression stage. The power supply is connected to a standard high voltage D.C. power source 19 for resonant charging an energy storage system which is shown as a capacitor CO. A start switch S1, which could be formed by ignitions or thyratrons, connects the capacitor CO to the first magnetic pulse compression stage. Operation of the start switch S1 is shown as being controlled by a controller 24.

The basis of operation of the saturable inductor magnetic switches, which include ferromagnetic material, is that up to the saturation limit of that material, the switching device will exhibit high inductance. However, when with time the magnetic field builds sufficiently, the saturable material will reach saturation, causing the permeability to drop to that of an air core inductor. The non-linear inductance properties of the magnetic switches are best shown in FIG. 2, which shows the sharply cornered hysteresis loop resulting from plotting magnetizing force field intensity (H) against magnetic flux density (B). The area enclosed by the loop represents heat generated during each cycle of operation of the switch 20. This heat must be dissipated if the switch is to be used in a repetitively pulsed system. Otherwise, the temperature of the magnetic material will exceed its Curie temperature, resulting in the loss of its ferromagnetic properties.

The current pulse compression is shown graphically in FIG. 3. It should be noted that the curves of FIG. 3 are not to scale and are only for purposes of explanation. Also the construction of successive saturable inductor switches might be varied (as will be explained hereafter) so that successive switches saturate faster. After the energy storage system CO is charged, when the start switch S1 is placed in its conductive condition by receiving a signal from the controller 24, a long, low-amplitude current pulse charges capacitor C1. As capacitor C1 accumulates a charge as a function of time, the voltage across it rises as does the current through the switch 20. The magnetic switch 20 is saturated by the current at the time when C1 is nearly charged, causing the energy in the capacitor C1 to be transferred resonantly to the capacitor C2. The process is continued from stage to stage with the pulse transfer time decreasing and the pulse energy substantially maintained so that at the end of the chain a short-duration, fast rise time, high amplitude current pulse is generated. While three pulse compression stages are shown, the number of stages needed may vary to achieve optimum efficiency for a particular load.

Figure 6:
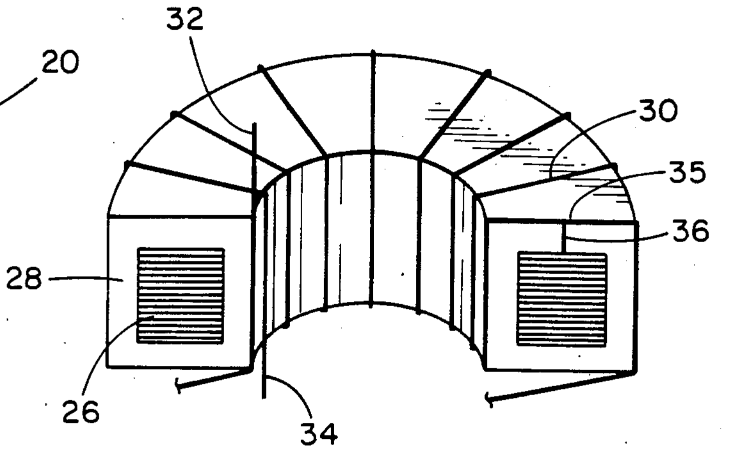
FIG. 6 is an isometric projection of one of the insulated cores of FIG. 4 with certain components broken away to expose other components.

The construction of the saturable inductor switch 20 is best discussed with reference to FIGS. 4 and 6. The switch includes a number of spaced cores 26 made of ferromagnetic material. The cores are preferably toroidal in shape, identical in size and construction and are arranged in adjacent, stacked relationship to have a common axis. Each core has an insulative layer 28 disposed about it. The switch also includes an electrical winding 30 on each core. Each winding preferably has the same number of turns and is wound in the same sense. Each winding has a first end 32 a second end 34 and preferably has its midpoint 35 connected to its respective core by a lead 36. The individual cores are placed closely adjacent to minimize stray inductance but an air or oil gap spaces adjacent cores so that a cooling medium (e.g., air or oil) can circulate between them and so that they are sufficiently electrically isolated to prevent core-to-core voltage breakdown.

As shown in FIG. 5, a schematic representation of the switch 20, the various windings are connected in series, and a capacitance is disposed between adjacent cores and/or across each winding. These are shown as capacitors C4 and may be external discrete devices or they may be parasitic capacitance. The advantage of the capacitors is that they help divide voltage evenly among the cores 26 during the saturation process of the switch before it switches to its low impedance state. The connection between the midpoint of a winding to its respective core substantially limits the maximum voltage drop between any point of the electrically conductive core and any point on its respective winding to one half the voltage drop across that winding. Thus the combination of the capacitors and the connection of the midpoints of the windings to their corresponding cores results in a minimization of voltage differential between the cores and their windings and thus the need for insulation is reduced, even at higher operating voltages. Referring to FIG. 7, the various cores and windings of the switch are preferably disposed in an aligned, stacked relationship in an insulative tube 38 which, in turn, is positioned in an outer metallic tube 40. The metallic tube can then be used as a coaxial current return from the load. Grounding the return prevents the inductor switches from establishing external fields, and shields the cores to prevent external fields from affecting the operation of the switches.

A figure of merit for a saturable inductor switch is the ratio of its unsaturated inductance to its saturated inductance. The higher the ratio, the more the saturable inductor switch 20 approximates the action of a perfect switch: infinite impedance when open, zero impedance when closed. Referring to FIG. 6, the unsaturated inductance of a saturable inductor switch is given by the expression:

$$\frac{\mu_o N^2 (A_w - A_c)}{l_m} + \frac{\mu_{unsat} N^2 A_c}{l_m}$$

where:

$\mu_o$=the permeability of air $\mu_{unsat}$=the permeability of the core material prior to saturation N=the number of turns $A_w$=the cross-sectional area enclosed by the winding $A_c$=the cross-sectional area of the core $l_m$=the magnetic path length The first term in the expression represents the contribution from the insulative layer 28. However, because $\mu_{unsat}$ is so much greater than $\mu_o$, the first term is negligible (particularly if the insulative layer is thin) and the unsaturated inductance is approximately equal to:

$$\frac{\mu_{unsat} N^2 A_c}{l_m}$$

The saturated inductance of the saturable inductor switch under consideration is:

$$\frac{\mu_o N^2 (A_w - A_c)}{l_m} + \frac{\mu_{sat} N^2 A_c}{l_m}$$

where: $\mu_{sat}$ is the permeability of the core material after saturation. Here the first term cannot be dismissed because of the difference in permeabilities because $\mu_{sat}$ is approximately equal to $\mu_o$. Thus the ratio of unsaturated inductance to saturated inductance is approximately equal to:

$$\frac{\dfrac{\mu_{unsat} N^2 A_c}{l_m}}{\dfrac{\mu_o N^2 (Aw - Ac)}{l_m} + \dfrac{\mu_{sat} N^2 A_c}{l_m}}$$

However the first term of the denominator can be reduced by thinning the layer of insulation spacing the winding from the core. This is desirable because it increases the magnetic coupling between the winding and the core. The best coupling can be achieved by placing the winding on the core so that $A_w = A_c$. In that case, the ratio simplifies to $\mu_{unsat}/\mu_{sat}$ so that the ratio is determined by the magnetic characteristics of the core material.

There are a number of advantages to using the multiple core or "floating-core" construction of the present invention over prior art saturable inductor switches employing a single large core with a single winding. The main advantage is that a better switch is achieved using less material. As explained above, less insulation is required because the total voltage across the switch is generally evenly distributed and less insulation results in closer coupling of the winding and its core. Additionally, it will be appreciated by those of skill in the art that the volume of core material needed to achieve a given switching function is inversely proportional to the stacking factor (which in the ratio of core cross-sectional area to the winding cross-sectional area). Thus the multiple core construction of the saturable inductor switch 20 results in less material, smaller size and less weight to achieve a switch functionally comparable switch to one of single core construction.

Additionally the multiple core construction is better suited for applications requiring repetitive power pulses because this construction is better able to dissipate heat resulting from the hysterectical behavior of the cores. Since the cores are spaced, they have more surface area to radiate heat. Additionally the cooling medium could be forced past the cores to achieve even faster removal of heat.

The use of multiple cores also achieves certain economics and flexibility in manufacturing of the saturable inductor switches because common cores can be used to construct switches having a variety of inductances depending on how many of the cores are stacked. Thus only a limited number of different size cores need be wound (or stocked). Due to this modular nature, the desired characteristics (time, voltage, inductance) of the completed switch need only be divided by those characteristics associated with each wound core to determine the number of cores required for the construction of the desired switch. This is because the sum of the "volt-seconds" needed for saturation of the individual cores is equal to the "volt-seconds" of the desired high voltage switch.

The sum of the inductances associated with the individual windings is equal to the inductance of the switch. Since cores 26 of substantially identical size and shape are used and the winding on each core has the same number of turns, each of the cores making up the switch saturates at the same time because the same current flows through each of the series-connected windings.

Preferably the cores are constructed of an amorphous magnetic material which has high resistivity to reduce eddy current losses. Such a material is metallic glass sold under the trademark Metglas by Allied Co. The insulation is preferably a polycarbonate and the windings are formed of insulated copper wire.

In view of the above, it will be seen that the several objects of the invention are achieved and other advantageous results attained.

As various changes could be made without departing from the scope of the invention, it is intended that all matter contained in the above description shall be interpreted as illustrative and not in a limiting sense.

What is claimed is:

1. A magnetic pulse compression power supply for supplying a high current, fast rise time power pulse to a load to which said power supply is connected by a first conductor and a second conductor, said power supply comprising:

a high voltage D.C. power source; and a series of pulse compression stages interconnected between said power source and said load, each stage comprising a saturable inductor magnetic switch having a first end and a second end connected in series with the switches of the other stages and with the second end of the switch of the final stage being connected to the first conductor of the said load, each stage also including a shunt capacitor bank connected between the first end of the switch of that stage and the second conductor of said load, each of said switches comprising:

a plurality of spaced cores with each core being made of ferromagnetic material;

an insulative layer about each core; and an electrical winding on each of said cores about its insulative layer, each winding having first and second ends and being electrically connected to its respective core intermediate its ends, the windings being connected in series in that the second end of a winding is directly connected to the first end of the next adjacent winding, all of said cores having substantially the same size and shape and all windings having substantially the same number of turns, all of said cores saturating substantially simultaneously, said cores being closely adjacent but not contiguous with a gap spacing each pair of closely adjacent cores so that a cooling medium can circulate between adjacent cores.

2. A magnetic pulse compression power supply as set forth in claim 1 wherein each core of each of said switches is toroidal and the cores of a said switch are arranged to have a common axis.

3. A magnetic pulse compression power supply as set forth in claim 2 further comprising a capacitor connected across each winding.

4. A magnetic pulse compression power supply as set forth in claim 3 further comprising a tubular dielectric sleeve containing said cores of a said switch and being coaxial therewith.

5. A magnetic pulse compression power supply as set forth in claim 4 further comprising a metallic outer sleeve disposed about said dielectric sleeve for serving as a current return from said load.

6. A magnetic pulse compression power supply as set forth in claim 1 wherein each core of each of said switches is electrically connected to the midpoint of its respective winding.

* * * * *